Figures 1, 2:
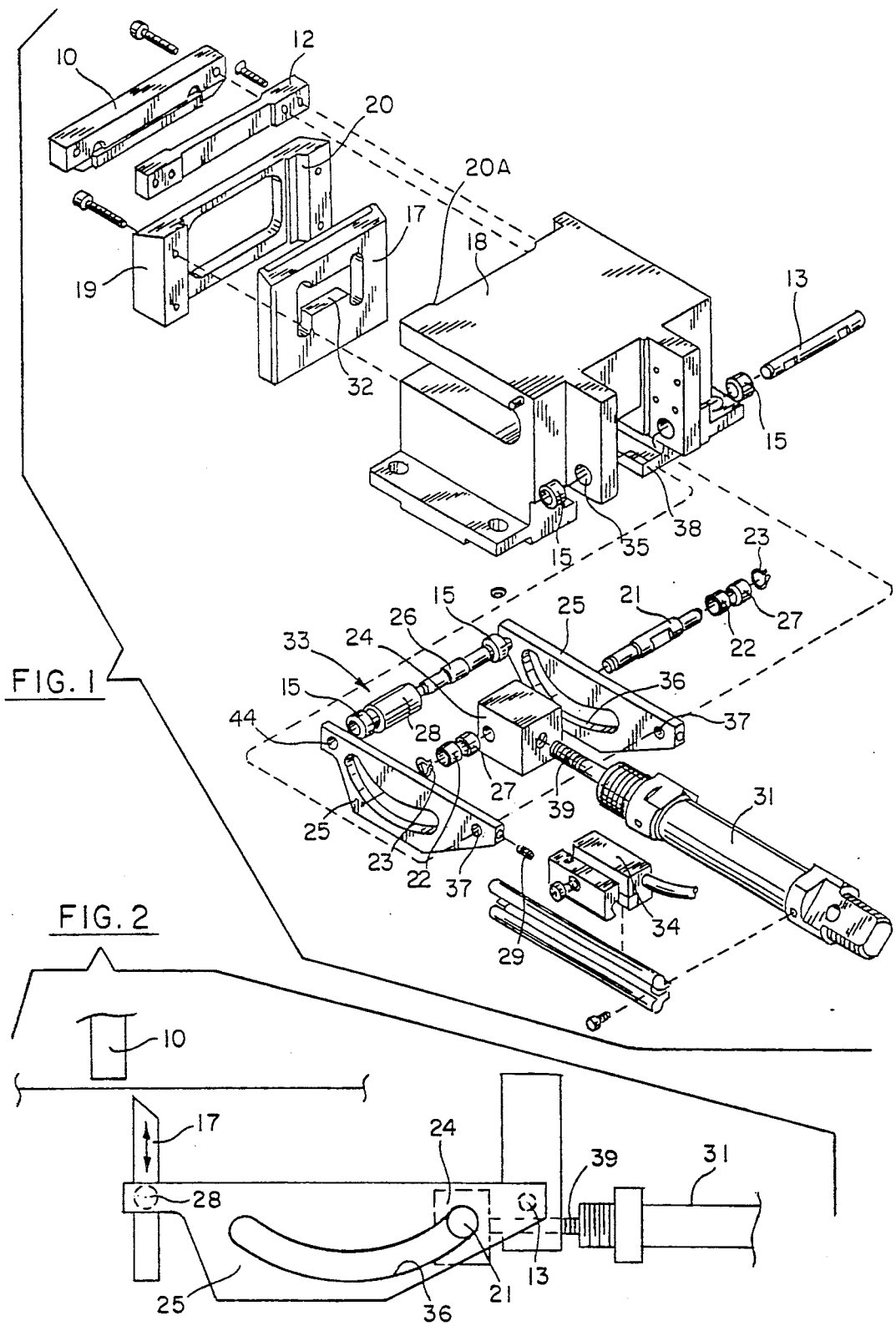

United States Patent

Jackson

[11] Patent Number: 5,125,307
[45] Date of Patent: Jun. 30, 1992

[54] CROPPING MECHANISM FOR SURFACE MOUNT PLACEMENT MACHINE

[75] Inventor: Rodney P. Jackson, Auburn, N.H.
[73] Assignee: Emhart Inc., Newark, Del.
[21] Appl. No.: 612,167
[22] Filed: Nov. 13, 1990
[51] Int. Cl.$^5$ .................. B26D 5/08; F16H 21/44
[52] U.S. Cl. ........................ 83/605; 83/601; 83/633; 83/635; 83/694; 30/241; 74/104; 74/110
[58] Field of Search ............... 83/522.16, 605, 610, 83/611, 694, 948, 613, 627, 633, 635; 30/113, 182, 183, 184, 189, 190, 208, 241, 242; 74/104, 110

[56] References Cited

U.S. PATENT DOCUMENTS

| | | | |
|---|---|---|---|
| 3,696,684 | 10/1972 | Estlick | 74/104 |
| 3,817,139 | 6/1974 | Desai et al. | 83/635 X |
| 3,828,639 | 8/1974 | Roch | 83/635 X |
| 4,545,273 | 10/1985 | Stamp | 83/605 X |
| 4,593,573 | 6/1986 | Bond | 74/104 |

FOREIGN PATENT DOCUMENTS 148771 2/1955 Sweden .................. 83/635

Primary Examiner—Frank T. Yost
Assistant Examiner—Clark F. Dexter
Attorney, Agent, or Firm—Spencer T. Smith

[57] ABSTRACT

A cropping mechanism for a surface mount machine is disclosed which cuts the feed tape supplying electronic components. The displacement of an actuator in one direction between end positions cycles the cropping blade from a start location to the cutting location and back to the start location. The actuator has a cam which rides in selectively configured slots defined in opposed, pivotally supported levers which support a pin received by the cutting element and controlling its displacement.

1 Claim, 1 Drawing Sheet

CROPPING MECHANISM FOR SURFACE MOUNT PLACEMENT MACHINE

The present invention relates to machines for placing surface mount components on circuit boards.

In such surface mount machines components are supplied on reels which present the components in pockets defined in the tape. Following component pick up, the empty tape portion is cut off or cropped and drawn away by vacuum to a collection location. Since such a machine places a large number of components per minute it is very important that tape cropping occur as quickly as possible.

It is accordingly an object of the present invention to provide a tape cropper which can be rapidly operated.

Additional objects and advantages of the present invention will become apparent from the following portion of this specification and from the accompanying drawings which illustrate in accordance with the mandate of the patent statutes a presently preferred embodiment incorporating the principles of the invention.

Referring to the drawings:

FIG. 1 is an exploded oblique view of the cropping mechanism for a surface mount placement machine made in accordance with the teachings of the present invention; and FIG. 2 is a side elevational view showing the assembly of the operational parts illustrated in FIG. 1.

The empty feed tape (not shown) is fed between a fixed cutter 10 which is secured via a spacer 12 to the housing 18 and a moving cutter 17 which is supported for vertical movement within a track 20,20A defined between the housing 18 and the housing cover 19. The blade has a horizontal slot 32 which receives an actuator pin assembly 33 including an actuator pin 26 and a sleeve 28 rotatably supported by a pair of needle bearings 15.

The ends of the acutator pin 26 are located in suitable holes 44 in a pair of control levers 25 and the control levers are secured at the other end via suitable screws 29 to a pivot pin 13 which extends through holes 37 in the control levers 25 and which is pivotally supported by needle bearings 15 secured within housing holes 35. Each control lever has a cam track 36 which receives an outer race bearing 22 which is held proximate one end of a camming pin 21 by a snapring 23. A bearing 27 is secured at each end of the camming pin 21 by snaprings 23 and rolls along internal rails 38 defined in the housing 18. The camming pin 21 is fixedly located within a coupling block 24 by the threaded end 39 of the air cylinder 31 so that the displacement of the camming pin from one end of the cam tracks 36 to the other end will effect a complete cycle of the cutting blade 17. A single position sensor 34 confirms that the cutting blade 17 has moved to the uppermost cutting location. This sensor will accordingly operate each stroke of the cylinder.

I claim:

1. A surface mount machine which has a tape feeder for electronic components to be placed by the machine comprising a tape cropping mechanism including
   a movable cutting element including pin receiving means,
   means for displacing said cutting element through a complete cutting cycle including
      a pair of spaced lever means pivotally supported at one end,
      actuator pin means extending between the other end of said pair of lever means and received by said pin receiving means,
      opposed camming clots in said pair of lever means,
      camming pin means received by said opposed camming slots,
      means for displacing said camming pin means from one end to the other end of said camming slots,
      said slots being selectively configured so that the movement of said camming pig means from one end to the other end of said slots will cycle with movable cutting element from a start location to a cutting location and back to a start location.

* * * * *